United States Patent
Ray et al.

(10) Patent No.: US 6,800,426 B2
(45) Date of Patent: Oct. 5, 2004

(54) PROCESS FOR MAKING A TWO LAYER THERMAL NEGATIVE PLATE

(75) Inventors: Kevin Barry Ray, Fort Collins, CO (US); Anthony Paul Kitson, Evans, CO (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 115 days.

(21) Appl. No.: 10/016,173

(22) Filed: Dec. 13, 2001

(65) Prior Publication Data

US 2003/0118949 A1 Jun. 26, 2003

(51) Int. Cl.⁷ ................................................ G03F 7/00
(52) U.S. Cl. .................. 430/322; 430/166; 430/300; 430/302; 430/325; 430/328; 430/330; 430/944
(58) Field of Search .................. 430/166, 300, 430/302, 322, 325, 328, 330, 944, 327

(56) References Cited

U.S. PATENT DOCUMENTS

| | | | |
|---|---|---|---|
| 4,544,627 A | 10/1985 | Takahashi et al. | 430/325 |
| 4,576,901 A | 3/1986 | Stahlhofen et al. | 430/325 |
| 5,631,119 A * | 5/1997 | Shinozaki | 430/326 |
| 5,641,608 A * | 6/1997 | Grunwald et al. | 430/302 |
| 5,705,308 A | 1/1998 | West et al. | 430/165 |
| 5,705,322 A | 1/1998 | West et al. | 430/325 |
| 5,858,626 A | 1/1999 | Sheriff et al. | 430/326 |
| 5,919,601 A | 7/1999 | Nguyen et al. | 430/278.1 |
| 6,294,311 B1 | 9/2001 | Shimazu et al. | 430/271.1 |
| 6,387,595 B1 * | 5/2002 | Teng | 430/302 |
| 6,528,228 B2 | 3/2003 | Hauck et al. | 430/166 |

FOREIGN PATENT DOCUMENTS

| | | | | |
|---|---|---|---|---|
| EP | 626 273 | * | 11/1994 | B41N/3/03 |
| EP | 0864420 | | 9/1998 | |
| EP | 0908305 | | 4/1999 | |
| EP | 0908307 | | 4/1999 | |
| EP | 0908779 | | 4/1999 | |
| EP | 0908784 | | 4/1999 | |
| EP | 0914941 | | 5/1999 | |
| EP | 0919868 | | 6/1999 | |
| EP | 0960728 | | 12/1999 | |
| WO | WO96/20429 | | 7/1996 | |
| WO | WO 01/46318 | * | 6/2001 | C08L/35/00 |

OTHER PUBLICATIONS

Reiser, Photoreactive Polymers, The Science and Technology of Resists, Wiley–Interscience, New York, 1989, pp. 161–167.

* cited by examiner

*Primary Examiner*—Nicole Barreca
(74) *Attorney, Agent, or Firm*—RatnerPrestia

(57) ABSTRACT

A process for forming a negative image useful as a printing plate is disclosed. A photosensitive assembly that comprises (a) a hydrophilic support, (b) a first layer that comprises a polymer that is soluble or dispersible in an aqueous alkaline solution, (c) a second layer that comprises at least one o-quinonediazide compound, and (d) an infrared absorbing compound is: (1) flood exposed with ultraviolet radiation; (2) imagewise exposed with infrared laser radiation; and (3) developed to produce the negative image.

19 Claims, No Drawings

PROCESS FOR MAKING A TWO LAYER THERMAL NEGATIVE PLATE

BACKGROUND OF THE INVENTION

1. Field of the Invention

The present invention relates to process for making a thermally sensitive, negatively-working printing plate having excellent unbaked press chemical resistance.

2. Brief Description of Art

The art of lithographic printing is based upon the immiscibility of oil and water, wherein the oily material or ink is preferentially retained by the image area and the water or fountain solution is preferentially retained by the non-image area. When a suitably prepared surface is moistened with water and ink is then applied, the background or non-image areas retain the water and repel the ink while the image areas accept the ink and repel the water. The ink on the image areas is then transferred to the surface of a material upon which the image is to be reproduced, such as paper, cloth and other materials. Commonly, the ink is transferred to an intermediate material called the blanket which in turn transfers the ink to the surface of the material upon which the image is to be reproduced.

A widely used type of lithographic printing plate has a radiation-sensitive coating applied to an aluminum base support. The coating may respond to radiation by having the portion that is exposed become soluble so that it is removed in the developing process. Such a plate is referred to in the art as a positive-working printing plate. Conversely, when that portion of the coating that is exposed becomes hardened, the plate is referred to as a negative-working plate. In both instances, the coating areas remaining after development (the image areas) are ink-receptive or oleophilic and the coating areas or background removed development (the non-image areas) are water-receptive or hydrophilic. In the case of direct digital imaging, the plate is exposed to infrared radiation from a laser. The path of the laser is predetermined by a computer program. In the instance of negative-working plates, the areas on the plate corresponding to the image areas are hit by the laser, allowing the infrared radiation to harden the image area coating, while the areas on the plate corresponding to non-image areas are not hit by the laser, thus preventing the radiation-hardening process, so the areas not struck by infrared radiation can be removed during development. The radiation-hardened surfaces of a negative-working plate are therefore oleophilic and will accept ink while the non-image areas that have had the coating removed through the action of a developer are desensitized and are therefore hydrophilic.

Direct digital imaging of offset printing plates is a technology that has assumed increased importance to the printing industry. Successful workings of such technology have used either single lasers or an array of lasers that emit modulated near IR or IR radiation have been used. In particular, high output and compact solid-state laser devices and semiconductor laser devices emitting modulated near infrared or infrared rays of a wavelength of about 750 nm to 1,200 nm have been employed as the radiation source for recording in the direct production of a printing plate from digital computer data. Such laser devices include those using a laser emitting at about 830 nm or at about 1056 nm or about 1112 nm. Commercially available imaging devices include the CREO Trendsetter available from Creo of British Columbia, Canada and the Gerber Crescent 42T available from Gerber of Brussels, Belgium.

Several specific methods of such employing laser technologies in the production of printing plates have been described in the patent literature, including the following:

U.S. Pat. No. 4,544,627 (Takahashi et al. assigned to Fuji Photo Film) discloses a negative image forming process which comprises (1) uniformly exposing a photosensitive material comprising a photosensitive material comprising a support layer having a sensitive layer thereon to actinic radiation; (2) subsequently imagewise exposing that uniformly exposed photosensitive material with a laser beam; and (3) then developing that imagewise exposed photosensitive material with an alkaline developing solution. The sensitive layer comprises (a) an o-quinonediazide component and (b) a second compound which is capable of varying the dissolution rate in the developing solution. The uniform exposure with actinic radiation converts the o-quinonediazide compound to the corresponding indenecarboxylic acid compound. The imagewise exposure of the sensitive layer with the laser beam renders the indenecarboxylic acid compound in the imagewise exposed areas to be converted to the corresponding indene compound. The developing step dissolves out the areas of the sensitive layer that were not imagewise exposed with the laser beam. The presence of the second compound in the sensitive layer reduces the rate of dissolution of the laser exposed areas in the developing solution. This patented process involves the use of a single sensitive layer that is placed directly on the support layer and does not teach or suggest the addition of a intermediate polymer layer between the support layer and the naphthoquinonediazide-containing sensitive layer or the advantages of employing such an intermediate polymer layer.

PCT Published Patent Application No. WO 96/20429 (Bennett et al. —assigned to Horsell P.L.C.) discloses a method of forming a lithographic plate which comprises (1) coating a lithographic base with a positive working photosensitive composition; (2) overall exposing the photosensitive composition on the plate with ultraviolet light to render the photosensitive composition developable; (3) imaging the thus overall exposed photosensitive composition on the plate with a laser; and (4) then developing the plate to remove those areas of the photosensitive composition not exposed to the laser. The photosensitive composition comprises (a) naphthoquinonediazide ester; (b) a phenolic resin and (c) at least one substance which absorbs infrared radiation. This process also involves the use of a single sensitive layer that is placed directly on the lithographic base and does not teach or suggest the addition of a intermediate polymer layer between the support layer and the naphthoquinonediazide-containing sensitive layer or the advantages of employing such an intermediate layer.

European Published Patent Application No. 0 864 420 A1 (Van Damme et al.—assigned to Agfa-Gevaert N.V.) discloses a lithographic process that comprises (1) making a lithographic imaging element having (a) a lithographic base having a hydrophilic surface, (b) a hydrophobic layer placed on the base, said hydrophobic layer comprising a polymer that is soluble or dispersible in an aqueous alkaline solution; and (c) a top layer placed on the hydrophobic layer, said top layer sensitive to IR-radiation; (2) imagewise exposing the element to IR-radiation; and (3) developing the exposed imaging element with an aqueous alkaline developing solution. The top layer comprises an IR-absorbing compound, a binder resin and optionally, a compound sensitive to visible light and/or UV-radiation. The hydrophobic intermediate layer is preferably composed of hydrophobic binders conventionally used in positive or negative working PS-plates, e.g. novolacs, polyvinyl phenols, or carboxy-substituted polymers. This method uses a one-stage exposure process that does not include a UV-flood exposure before the imagewise IR-radiation exposure.

European Published Patent Application No. 0 908 305 A1 (Deroover et al.—assigned to Agfa Gevaert N.V.) discloses a method for making lithographic printing plates that comprises the steps of (1) preparing a heat mode imaging element comprising (a) a lithographic base with a hydrophilic surface; (b) a polymeric first layer on top of the base, said polymeric first layer including a polymer that is soluble in an aqueous alkaline solution; and (c) a top layer on top of the first layer, said top layer including an IR-dye and being sensitive to IR-radiation and is impenetrable for an alkaline developer containing $SiO_2$ as silicate; (2) imagewise exposing this heat mode imaging element to IR-radiation; and (3) developing said imagewise exposed heat mode element with a silicate-containing alkaline developer so that exposed areas of the top layer and the underlying areas of the first layer are dissolved and the unexposed areas of the top layer and the underlying portions thereof remain undissolved. This process also uses a one-stage exposure process that does not include a UV-flood exposure before the imagewise IR-radiation exposure.

European Published Patent Application No. 0 908 307 A2 (Van Damme et al.—assigned to Agfa-Gevaert N.V.) disclosed a method for making positive printing plates that is similar to the method disclosed in EP 0 908 305 A1 except the IR-sensitive top layer includes selected IR-dyes. This method also uses a one-step exposure process that does not include a UV-flood exposure before the imagewise IR-radiation exposure.

European Published Patent Application No. 0 908 779 A1 (Vermeesch et al.—assigned to Agfa-Gevaert A.G.) discloses a method for making positive working printing plates from a heat mode sensitive imaging element that is similar to the method disclosed in EP 0 908 305 A1 except the top layer includes an organic quaternary ammonium salt. This method also employs a one-stage exposure that does not include a UV-flood exposure before the imagewise IR-radiation exposure.

European Published Patent Application No. 0 908 784 A1 (Vermeesch et al.—assigned to Agfa-Gevaert N.V.) also teaches a method of making positive working printing plates from a light sensitive imaging element that is similar to the method of EP 0 908 305 A1 except the top layer includes a diazonium salt and at least 20% of its weight is a non-proteinic hydrophilic film-forming polymer. Again, this method uses a one-stage exposure that does not include a UV-flood exposure before this imagewise IR-radiation exposure.

European Published Patent Application No. 0 908 728 A1 (Verschueren et al. assigned to Agfa-Gevaert N.V.) discloses a method for making lithographic printing plates that is similar to the method disclosed in EP 0 980 305 A1 except that the top layer contains at least one compound containing epoxy units and a hardener. Again, this method uses a one-stage exposure that does not include a UV-flood exposure before the imagewise IR-radiation exposure.

European Published Patent Application No. EP 0 914 941 A1 (Vermeesch et al.—assigned to Agfa-Gevaert N.V.) discloses a method for making positive working printing plates from a heat mode sensitive imaging element that is similar to the method disclosed in EP 0 908 305 A1 except that the alkaline developer used herein has a pH of at least 12 and a surface tension of at least 30 mN/m. Also, Example 3 of this patent application discloses the use of naphthoquinonediazide-containing compound in the top layer. Like the previously referred to Agfa references, this method uses a one-stage exposure that does not employ a UV-flood exposure before the imagewise IR-radiation exposure.

European Published Patent Application No. 0 919 868 A1 (Nakamura et al.—assigned to Fuji Photo Film, Ltd.) discloses a positive-type image forming process which comprises (1) coating a specific imaging-forming material onto a suitable substrate; (2) subjecting the imaging-forming material to imagewise exposure, preferably with a IR-radiation source; (3) optionally, heating the imaged material; and (4) subjecting the heated, imaged material to a developing solution to form a positive image. The image-forming material comprises (a) an aqueous alkaline solution-soluble polymer having a phenolic hydroxy group; (b) a compound that will suppress the aqueous alkaline solubility of the polymer (a), but loses that property when decomposed by light or heat; and (c) a cross-linkable compound that will cross-link with the polymer (a) upon heating and will increase the solubility-suppressing effect of compound (b). One preferred class of compound (b) is naphthoquinone diazide compounds. When this positive-type imaging-forming material is imaged with a laser, the laser-irradiated portion of the material becomes soluble in the developer (i.e. compound (b) loses its "solubility-suppressing effect" in those portions) whereas in the non-laser-irradiated portion, this compound (b) still suppresses the aqueous alkaline solubility of that portion. Accordingly, an image is formed on the printing plate by developing due to the differences in the aqueous alkaline solubilities of the two different portions. Again, this reference uses a one-stage exposure that does not employ a UV-flood exposure before the imagewise IR-radiation exposure.

U.S. Pat. No. 5,705,308 (West et al.—assigned to Kodak Polychrome Graphics) discloses a method of forming a positive image through infrared exposure that comprises (1) imagewise exposing with infrared radiation an imaging layer on a support; (2) preferably, flood-UV exposing the imagewise exposed layer; and then (3) developing the imaged layer with an aqueous developing solution to remove the imaged areas of that layer. The imaging layer contains two essential components, namely, an infrared absorbing compound and a phenolic resin that is either mixed or reacted with an o-diazonaphthoquinone compound. These patented methods involve the use of a single imaging layer and do involve a non-imaging polymeric intermediate layer between the support and the imaging layer.

While the above-noted processes have produced commercially acceptable printing plates, it has been found that the new types of fountain solutions now commonly used to wet the non-imaged areas of the plate are more aggressive towards the coating layers than prior types of fountain solutions. When these aggressive fountain solutions are used with conventional single layer coating layers, they can undesirably remove some of the imaged areas of the plate before those areas are inked or they can attack these imaged areas during the printing run, thus reducing the useful lifetime of the plate. To overcome this problem, a post-development heating step has been used to obtain the required chemical resistance of the coating layer to these aggressive fountain solutions. However, such post-development heating steps complicate the printing plate fabrication process and increase the cost of the plates. Accordingly, there is a need to overcome this problem. The present invention overcomes this problem.

BRIEF SUMMARY OF THE INVENTION

Therefore, one aspect of the present invention is directed to a negative-working image forming process which comprises the steps of:

(1) flood exposing with actinic radiation a photosensitive assembly that comprises:
  (a) a hydrophilic support which can be used as a lithographic base and having thereon;
  (b) a first layer comprising at least one polymer that is soluble or dispersible in an aqueous alkaline solution;
  (c) a second layer on top of the first layer, the second layer comprising at least one o-quinonediazide compound; whereby the flood exposure causes the at least one o-quinonediazide compound to be converted to the corresponding indenecarboxylic acid compound; and
  (d) at least one photothermal conversion material in either the first layer or second layer or both;
(2) imagewise exposing the flood exposed photosensitive assembly with infrared radiation to thereby convert the indenecarboxylic acid compound in the second layer in the imagewise exposed areas to the corresponding indene compound; and
(3) developing the imagewise exposed photosensitive assembly with an alkaline developing solution to dissolve out the imagewise unexposed area of the second layer and the areas of first layer underlying the imagewise unexposed areas of second layer and thereby producing a negative working image.

The present invention has several commercially significant advantages. A thermally sensitive, negatively working printing plate having excellent press chemical resistance but not requiring baking may be produced because this particular two layer coating structure provides extra protection against the aggressive fountain solutions. Also, this process allows for the use of low pH (i.e., below about 13.5) developers, thereby increasing the window of operation for this process. Finally, because the process is negative-working, the laser used in the imagewise exposure step will last longer than if the process was positive working.

DETAILED DESCRIPTION OF THE INVENTION

The term "actinic radiation" as used in the present specification and claims refers to any radiation that the o-quinonediazide compound is sensitive so to be converted into the corresponding indenecarboxylic acid compound. The preferred actinic radiation is UV radiation in the wavelength range from about 290 nm to about 500 nm, although an electron beam can be used as the source of actinic radiation.

The term "infrared radiation" as used in the present specification and claims refers to any radiation that converts indenecarboxylic acid compounds to the corresponding indene compounds. The preferred infrared radiation is created by a laser at either 830 nm, 1064 nm or 1112 nm.

The photosensitive assembly of the present invention has three elements: (1) a hydrophilic support which can be used as a lithographic base; (2) a first layer comprising at least one polymer that is soluble or dispersible in an aqueous alkaline solution; and (3) a second layer that comprises at least one o-quinonediazide compound. Either the first layer or the second layer contains a photothermal conversion material such as an infrared absorbing compound.

The supporting substrate to be used as the lithographic base in the present invention is a dimensionally stable plate-like substance, and examples thereof include paper, paper laminated with a plastic (such as polyethylene, polypropylene, and polystyrene), metal plates (such as aluminum, zinc, and copper), plastic films (such as polyester, cellulose diacetate, cellulose triacetate, cellulose propionate, cellulose butyrate, cellulose acetate/butyrate, cellulose nitrate, polyethylene terephthalate, polyethylene, polystyrene, polypropylene, polycarbonate, and polyvinyl acetal), and paper or plastic film laminated or deposited with the above-described metals.

A polyester film or an aluminum plate is the preferred substrate in the present invention. In particular, an aluminum plate is particularly preferable since it has good dimensional stability and can be provided at a relatively low cost. Examples of preferable aluminum plates include pure aluminum plates and alloy plates comprising aluminum as the main component and trace quantities of different elements. Furthermore, plastic films at which aluminum is laminated or deposited can also be used. Examples of different elements which may be included in the aluminum alloy include silicon, iron, manganese, copper, magnesium, chrome, zinc, bismuth, nickel, and titanium. The amount of the different elements in the alloy is preferably 10% by weight or less. As mentioned above, in the present invention, pure aluminum is particularly preferable as a substrate material. However, since production of a completely pure aluminum is difficult in terms of refining technology, that containing trace quantities of different elements can be used. In short, the composition of the aluminum plate to be applied in the present invention need not be specifically defined, and a known aluminum plate may be used. The thickness of the aluminum plate to be used in the present invention is from about 0.1 mm to 0.6 mm, preferably from 0.15 mm to 0.4 mm, and more preferably from 0.2 mm to 0.3 mm.

When an aluminum plate is used as a substrate, it is desirable to conduct roughening treatment prior to the coating with the polymeric first layer. Also, prior to this roughening of the aluminum plate, a degreasing treatment with a surfactant, an organic solvent, or an aqueous alkaline solution may be conducted to remove the rolling oil from the surface as needed.

The surface roughening treatment of an aluminum plate can be implemented using various methods, such as a mechanically roughening method, an electrochemically roughening method in which a plate surface is electrochemically dissolved, and a chemically roughening method in which a plate surface is selectively dissolved using chemicals. As the mechanical method, known methods such as a ball abrasion method, brush abrasion method, blast abrasion method, and buff abrasion method can be used. As the electrochemically roughening method, a method in which an alternating current or direct current is applied to a plate in an electrolytic solution containing a hydrochloric acid or nitric acid can be used. Further, a method combining both (electrochemical and mechanical) methods as disclosed in JP-A No. 54-63,902 can be used.

The aluminum plate to which a surface roughening treatment as described above has been applied may be further subjected, if necessary, to an alkaline etching treatment or a neutralizing treatment, followed by an optional anodizing treatment so as to improve the water retention property and the abrasion resistance property of the surface. As the electrolyte used in the anodizing treatment of the aluminum plate, various electrolytes that can form a porous oxide film may be used. In general, sulfuric acid, phosphoric acid, oxalic acid, chromic acid, or a mixture thereof can be used as the electrolyte. The concentration of the electrolyte is suitably adjusted according to the type of electrolyte.

The treatment conditions of the anodization may not be specified since they significantly change depending on the type of the electrolyte solution used. In general, appropriate treatment conditions include a concentration of the electrolyte solution from 1 to 80% by weight, a temperature of the electrolyte solution from 5 to 70° C., a current concentration from 5 to 60 ampere/dm$^2$, a voltage from 1 to 100 V, and an electrolysis time from 5 seconds to 5 minutes.

If the amount of a film produced by anodization is less than 1.0 g/m$^2$, durability of the plate may be insufficient, and scratches may be easily produced in a non-image portion of the planographic printing plate, thereby easily causing so-called "scratch toning" in which ink adheres to such scratches in printing.

After the anodizing treatment, a hydrophilicity-increasing treatment may be applied to the aluminum surface, if necessary. Examples of the hydrophilicity-increasing treatment to be used in the present invention include an alkaline metal silicate (such as an aqueous solution of sodium silicate) method as disclosed in U.S. Pat. Nos. 2,714,066, 3,181,461, 3,280,734 and 3,902,734. In this method, the support (aluminum plate) is treated by immersing or electrolyzing the support, in an aqueous solution of sodium silicate. Other examples include a method of treating the aluminum plate with potassium fluorozirconate disclosed in JP-B No. 36-22063 and a method of treating it with polyvinyl phosphonate disclosed in U.S. Pat. Nos. 3,276,868, 4,153,461 and 4,689,272.

The first layer of the composite layer structure is composed of a polymeric material that is soluble or dispersible in an aqueous alkaline solution. A photothermal conversion material such as an infrared absorbing material is optionally added to this polymeric first layer. Other optional ingredients include colorants and coating improvers.

A group of preferred polymeric materials are copolymers that at least one functional group selected from the group consisting of carboxylic acid, N-substituted cyclic imide, and amide, preferably two of these functional groups, and more preferably all three functional groups. Preferably these polymeric materials comprise N-substituted maleimides, especially N-phenylmaleimide, methacrylamides, especially methacrylamide; and acrylic and/or methacrylic acid, especially methacrylic acid. The preferred polymeric materials of this type are copolymers of N-phenyl maleimide, methacrylamide and methacrylic acid, more preferably those that contain about 25 to 75 mol %, preferably about 35 to about 60 mol % of N-phenylmaleimide; about 10 to about 50 mol %, preferably about 15 to about 40 mol % of methacrylamide; and about 5 to about 30 mol %, preferably about 10 to about 30 mol % of methacrylic acid. Other hydrophilic polymers, such as hydroxyethyl methacrylate, may be used in place of some or all of the methacrylamide. Other aqueous alkaline soluble monomers, such as acrylic acid, may be use in place of some or all of the methacrylic acid.

These polymeric materials are soluble in aqueous alkaline developers. In addition, they are soluble in a methyl lactate/methanol/dioxolane (15:42.5:42.5 wt %) mixture, which can be used as the coating solvent for the underlayer.

In one embodiment of this invention, the first layer may also preferably contain a photothermal conversion material such as an infrared absorber. An infrared absorber may be selected from either a dye or pigment. A primary factor in selecting the infrared absorber is its extinction coefficient which measures the efficiency of the dye or pigment in absorbing infrared radiation in accordance with Beer's Law. The extinction coefficient must have a sufficient value in the wavelength region of infrared radiation exposure usually from 780 nm to 1300 nm. Particularly useful infrared absorbing dyes are of the cyanine class. Examples of infrared absorbing dyes useful in the present invention include, Cyasorb IR 99 and Cyasorb IR 165 (both available from Glendale Protective Technology), Epolite IV-62B and Epolite III-178 (both available from the Epoline Corporation), PINA-780 (available from the Allied Signal Corporation), Spectra IR 830A and Spectra IR 840A (both available from Spectra Colors Corporation), ADS 830A and ADS 1060A (ADS Corp) and EC 2117 (FEW Wolfen). Examples of infrared absorbing pigments are Projet 900, Projet 860 and Projet 830 (all available from the Zeneca Corporation). Carbon black pigments may also be used. Carbon black pigments are particularly advantageous due to their wide absorption bands since such carbon black-based plates can be used with multiple infrared imaging devices having a wide range of peak emission wavelengths.

One preferred photothermal conversion material is DYE A which has the following structure:

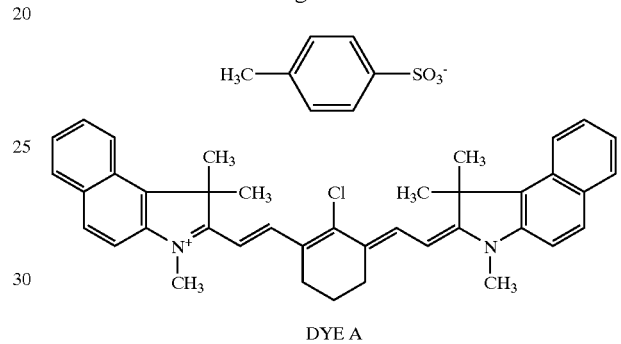

DYE A which is used in the single layer formulations described in Haley et al., U.S. Pat. No. 5,340,699, which is incorporated herein by reference.

This underlayer has a 1 minute soak loss in 80 wt % diacetone alcohol/20 wt % water of less than about 20 wt %, preferably less than 10 wt % and more preferably less than about 5 wt %. In favorable cases a soak loss of less than about 2 wt % in 80 wt % diacetone alcohol/20 wt % water may be obtained.

The resistance of an underlayer to aggressive washes, such as a UV wash, can be tested by a 1 minute soak loss in 80 wt % diacetone alcohol/20 wt % water. One minute soak loss is measured by coating a layer of the polymeric material on a substrate, typically at a coat weight of about 1.5 gm$^{-2}$, soaking the coated substrate in the appropriate solvent for 1 minute at room temperature, drying the coated substrate and measuring the weight loss as a percent of the total weight of polymeric material present on the substrate.

This first layer does not contain any photosensitive ingredients such as diazo compounds, photoacids, photoinitiators, quinone diazides, sensitizers and the like.

In the most preferred embodiment, the polymer is a terpolymer of methacrylamide, methacrylic acid and N-phenylmaleimide having mole fractions of 35:20:45, respectively. Also, in this preferred embodiment, the first layer does not contain a photothermal conversion material, but does contain small amounts of Brilliant Green dye as supplied by Aldrich of Milwaukee, Wis., and a polyether-modified polydimethyl siloxane (e.g. BYK307 available from BYK Chemie of Wallingford, Conn.). The optional dye is used as a colorant to distinguish this first layer from the second layer, while this optional siloxane material is used to obtain better coating layer on the support. The additives are commonly used in amounts of less than 5% by weight of the layer.

The polymer preferably comprises at least 75% by weight of the first layer, more preferably, at least 90% by weight of the first layer. The solubility inhibiting material, if used, preferably comprises about 5 to about 25% by weight of the first layer. The dye and siloxane, if used, preferably each comprises about 0.05 to about 5% by weight of the first layer.

The first layer is preferably prepared by adding the above-noted components to a suitable solvent or solvent combination to dissolve or disperse them in the solvent. Suitable solvents include methyl lactate, ethyl lactate, methyl ethyl ketone, diethyl ketone, ethylene dichloride, cyclohexanone, methanol, ethanol, propanol, methoxypropan-2-ol (DOWANOL PM) and water. These solvents are used alone or in combinations thereof.

The concentration of the above-noted solid components in the solvent is preferably from about 1 to about 50% by weight, more preferably from 3 to 30% by weight and most preferably from 5 to 20% by weight, of the solvent.

The polymeric first layer is coated onto the above-noted substrate by any known coating technique. Examples of such coating technology include rotation or spin coating, slot coating, wire bar coating, dip coating, air knife coating, roll coating, blade coating, curtain coating and the like. The preferred method is slot coating.

A layer of the polymeric first coat is preferably dried to a suitable temperature to remove excess solvent. This drying may be carried out in a hot air drier or infrared ray dryer or the like, preferably at temperatures from about 40° C. to about 150° C. for 30 seconds to 10 minutes.

The thickness of the resulting first layer, after drying, on the support can vary widely, but it is typically in the range from about 0.5 to about 2.5 microns, more preferably, from about 1 to about 2 microns.

The second layer contains one essential ingredient, at least one o-naphthoquinone diazide compound. Optional ingredients such as the photothermal conversion material may also be added.

The o-quinonediazide compound is a compound having at least one o-quinonediazide group, which increases its solubility in the alkali solution upon application of actinic radiation. Compounds having various structures have been known and described in detail in, for example, *Light-Sensitive Systems* written by J. Kosar, published by John Wiley & Sons, Inc. Particularly, o-benzo- or o-naphthoquinonediazide sulfonic acid esters of various hydroxyl compounds are preferred. Examples include 2,2'-dihydroxydiphenyl-bis(napthoquinone-1,2-diazide-5-sulfonic acid ester), 2,2',4,4'-tetrahydroxydiphenyl-tetra (naphthoquinone-1,2-diazide-5-sulfonic acid ester) and 2,3,4-trioxybenzophenone-bis(-naphthoquinone-1,2-diazide-5-sulfonic acid ester), and the like. Particularly, naphthoquinone-1,2-diazide-5-sulfonic acid esters of poly-hydroxyphenols prepared by poly-condensation of acetone and pyrogallol as described in Japanese Patent Publication 28403/68 (U.S. Pat. No. 3,635,709) are advantageously used. Other examples of o-naphthoquinone diazide compounds which may be used in the photosensitive composition are disclosed in a variety of publications such as U.S. Pat. Nos. 2,766,118; 2,767,092; 2,772,972; 2,859,112; 2,907,665; 3,046,110; 3,046,111; 3,046,115; 3,046,118; 3,046,119; 3,046,120; 3,046,121; 3,046,122; 3,046,123; 3,061,430; 3,102,809; 3,106,465; 3,635,709; and 3,647,443. Among these, particularly preferred are o-naphthoquinonediazidosulfonates or o-naphthoquinone-diaziodosulfonic acid amides or o-naphthoquinonediazidocarboxylic acid amides of aromatic amine compounds, for instance, esters of naphthoquinone-1,2-diazidosulfonic acid with polyhydroxyphenyl (hereinafter the term 'ester' also include partial esters); esters of naphthoquinone-1,2-diazido-4-sulfonic acid or naphthoquinone-1,2-diazido-5-sulfonic acid with pyrogallol/acetone resins, esters of naphthoquinone-1,2-diazidosulfonic acid with novolac (type phenol/formaldehyde resins or novolac type cresol/formaldehyde resins; amides of poly(p-aminostyrene) and naphthoquinone-1,2-diazido-4-sulfonic acid or naphthoquinone-1,2-diazido-5-sulfonic acid; esters of poly (p-hydroxystyrene) and naphthoquinone-1,2-diazido-5-sulfonic acid; esters of polyethylene glycol with naphthoquinone-1,2-diazido-4-sulfonic acid or naphthoquinone-1,2-diazido-5-sulfonic acid; amides of polymeric amines with naphthoquinone-1,2-diazido-4-sulfonic acid.

Preferably, the o-quinonediazide compound is employed as either (i) a mixture of a phenolic resin and an o-naphthoquinone diazide compound; (ii) a reaction product of a resin and an o-naphthoquinone diazide compound; or (iii) a mixture of (i) and (ii).

The resins useful in the practice of this invention to form a reaction product with an o-diazonaphthoquinone reactive derivative can be any type of resin that has a suitable reactive group for participating in such a reaction. For example, such resins can have a reactive hydroxy or amino group. The phenolic resins defined below are most preferred, but other resins include copolymers of acrylates and methacrylates with hydroxy-containing acrylates or methacrylates, as described for example in U.S. Pat. No. 3,859,099 (Petropoulos et al.), for example, a copolymer of hydroxyethyl methacrylate and methyl methacrylate. Still other useful resins include copolymers of styrene (or styrene derivatives) with aminostyrenes, as described for example in U.S. Pat. No. 3,759,711 (Rauner et al.), for example, a copolymer of styrene and p-aminostyrene.

The phenolic resins useful herein are light-stable, water-insoluble, alkali-soluble film-forming resins that have a multiplicity of hydroxy groups either on the backbone of the resin or on pendant groups. The resins typically have a molecular weight of at least about 350, and preferably of at least about 1000, as determined by gel permeation chromatography. An upper limit of the molecular weight would be readily apparent to one skilled in the art, but practically it is about 100,000. The resins also generally have a pKa of not more than 11 and as low as 7.

As used herein, the term "phenolic resin" includes, but is not limited to, what are known as novolac resins, resole resins and polyvinyl compounds having phenolic hydroxy groups. Novolac resins are preferred.

Novolac resins are generally polymers that are produced by the condensation reaction of phenols and an aldehyde, such as formaldehyde, or aldehyde-releasing compound capable of undergoing phenol-aldehyde condensation, in the presence of an acid catalyst. Typical novolac resins include, but are not limited to, phenol-formaldehyde resin, cresol-formaldehyde resin, phenol-cresol-formaldehyde resin, p-t-butylphenol-formaldehyde resin and pyrogallol-acetone resins. Such compounds are well known and described for example in U.S. Pat. No. 4,308,368 (Kubo et al.), U.S. Pat. No. 4,845,008 (Nishioka et al.), U.S. Pat. No. 5,437,952 (Hirai et al.) and U.S. Pat. No. 5,491,046 (DeBoer et al.), U.S. Pat. No. 5,143,816 (Mizutani et al.) and GB 1,546,633 (Eastman Kodak). A particularly useful novolac resin is prepared by reacting in-cresol or phenol with formaldehyde using conventional conditions.

Another useful phenolic resin is what is known as a "resole resin" that is a condensation product of bis-phenol A and formaldehyde. One such resin is commercially available as UCAR phenolic resin BKS-5928 from Georgia Pacific Corporation.

Still another useful phenolic resin is a polyvinyl compound having phenolic hydroxyl groups. Such compounds include, but are not limited to, polyhydroxystyrenes and copolymers containing recurring units of a hydroxystyrene, and polymers and copolymers containing recurring units of halogenated hydroxystyrenes. Such polymers are described for example in U.S. Pat. No. 4,845,008 (noted above). Other hydroxy-containing polyvinyl compounds are described in U.S. Pat. No. 4,306,010 (Uehara et al.) and U.S. Pat. No. 4,306,011 (Uehara et al.) which are prepared by reacting a polyhydric alcohol and an aldehyde or ketone, several of which are described in the patents. Still other useful phenolic resins are described in U.S. Pat. No. 5,368,977 (Yoda et al.).

A mixture of the resins described above can be used, but preferably, a single novolak resin is present in the photosensitive composition.

In the dried photosensitive layer of the element useful in this invention, the o-quinonediazide compound (i.e., reacted with a resin or mixed with a phenolic resin) is the predominant material. Generally, it comprises at least 60 weight percent of the layer, and more preferably, it is from about 95 to about 99 weight percent of the top layer.

In one embodiment, the phenolic resin is present in admixture with an o-diazonaphthoquinone derivative. Such compounds comprise an o-diazonaphthoquinone moiety attached to a ballasting moiety that has a molecular weight of at least 15, but less than about 5000.

An optional component of the second layer of imaging composition of this invention is a photothermal conversion material such as an infrared radiation absorbing compound (or IR absorbing compound), or mixture thereof as discussed above. Preferably, this photothermal conversion material is an IR absorbing compound.

The amount of infrared absorbing compound in the second or imaging layer is generally sufficient to provide an optical density of at least 0.5 in the layer, and preferably, an optical density of from about 1 to about 3. This range would accommodate a wide variety of compounds having vastly different extinction coefficients. Generally, this is at least 1 weight percent, and preferably from about 5 to about 25 weight percent.

Optional, non-essential components of this second layer of the imaging composition include colorants, other sensitizers, stabilizers, exposure indicators and surfactants in conventional amounts.

The amount of one or more such non-essential compounds in the imaging composition of this invention can vary widely, but generally, if used, they are present in amounts from 0.01 to about 2% by weight of the second layer.

The second layer is prepared in the same fashion as the first layer, namely, the solid ingredients are dissolved or dispersed in any suitable solvent or solvents to prepare a solution or dispersion that can be coated onto the first layer.

The second layer is coated onto the first layer and then dried in the same fashion as the first layer was coated and dried onto the support. Any suitable coating and drying technique may be employed.

It is desirable that the first and second layers be distinct layers. This is achieved by careful selection of solvents. The solvent used for the second or top layer should be selected so that it does not significantly dissolve or disperse the solid components of the first layer and thus maintain a clear demarcation between the two layers. Preferred solvents for the second layer include a mixture of cyclohexanone, DOWANOL PM and acetone or cyclohexanone and acetone.

When the photosensitive composition is formulated as a coating composition in suitable coating solvents, the solid content is an amount of at least 0.2 weight percent. Preferably, it is present in an amount of from about 5 to about 50 weight percent.

The thickness of the resulting first and second layer, after drying, on the support can vary widely, but typically it is in the range of from about 0.5 to about 2.5 microns, and preferably from about 1 to about 2 microns.

No other essential layers are provided on the element. In particular, there need be no protective or other type of layers over the photosensitive imaging layer. Optional, but not preferred, antihalation layers may be disposed under the imaging layer, or on the backside of the support (such as when the support is a transparent polymeric film).

The whole surface of the image recording material produced as described above is uniformly exposed (flood exposed) to actinic radiation to which the o-quinonediazide compound is sensitive, thereby the o-quinonediazide compound is converted to the corresponding indenecarboxylic acid (generally, light having the wavelength from about 290 nm to about 500 nm although an electron beam can also be used) in a conventional manner. Preferably, the overall exposure energy will be from about 5 to about 2500 mJ. As a light source of the actinic radiation, it is possible to use a mercury lamp, a xenon lamp, a carbon arc lamp, a tungsten lamp, a fluorescent lamp and sunlight, and the like. The o-quinonediazide is converted to the corresponding indenecarboxylic acid by exposing it to the actinic radiation.

The sensitive material is then exposed to infrared radiation (IR) by scanning a laser beam modulated by an image signal. This IR imaging may be carried out by well-known methods. For example, the photosensitive layer may be imaged with a laser or an array of lasers emitting modulated near IR or IR radiation in a wavelength region that is absorbed by the absorber. IR radiation, especially IR radiation in the range of 750 to 1200 nm, is typically used for imaging thermally imageable elements. Imaging is conveniently carried out with a laser emitting at about 830 or at about 1056 nm. The IR exposure energy is preferably from about 30 to about 500 mJ/cm$^2$; more preferably from about 30 to about 350 mJ/cm$^2$, and most preferably from about 50 to about 175 mJ/cm$^2$. Suitable commercially available imaging devices include imagesetters such as the CREO Trendsetter (CREO, British Columbia, Canada) and the Gerber Crescent 42T (GERBER, Brussels, Belgium). The time between the flood exposure and exposure with a laser can be somewhat prolonged. At ambient temperatures of 10° to 35° C., laser exposure can be postponed as long as 24 hours. At temperatures of 0° to 10° C. and preferably 0° to 5° C., the time between exposures may be a month.

The proposed image forming material is then subjected to the development processing. The developing solution used for the development processing may be any liquid or solution that can penetrate and remove the unexposed regions of the top layer and the underlying regions of the underlayer without substantially affecting the complimentary exposed regions. While not being bound by any theory or explanation, it is believed that image discrimination is based on kinetic effect. The unexposed regions of the top layer are removed more rapidly in the developer than the exposed regions. Development is carried for a long enough time to remove the unexposed regions of the top layer and the underlying regions of the underlayer in the developer, but not long enough to remove the exposed regions of the top layer. The preferred time in the developer is from about 10 to 120 seconds. Hence the unexposed regions are described as being "soluble" or "removable" in the developer because they are removed, and dissolved and/or dispersed, more rapidly in the developer than the exposed regions.

Useful developers are aqueous solutions having a pH of about 7 or above. Preferred aqueous alkaline developers are those that have a pH between about 8 and about 13.5, typically at least about 11, preferably at least about 12. Useful developers include commercially available developers such as PC3000, PC955, Goldstar, Greenstar and 956 aqueous alkaline developers each available from Kodak Polychrome Graphics LLC. Developers are described for example in Yamasue, U.S. Pat. No. 4,259,434, Seino U.S. Pat. No. 4,452,880, Miller U.S. Pat. No. 5,851,735, Eckler U.S. Pat. No. 5,998,102, Miro US EP-A-0732628, Toyama, GB-A-2276729 and Fiebag U.S. Pat. No. 6,143,479.

Development is typically carried out in a processor equipped with an immersion type developing bath, a section for rinsing with water, a gumming section, a drying section and a conductivity measuring unit. Typically the developer is applied to the imaged precursor by rubbing or wiping the element with an applicator containing the developer. Alternatively, the imaged precursor may be brushed with the developer or the developer may be applied to the precursor by spraying the element with sufficient force to remove the unexposed regions. In either instance, a printing plate is produced. Development may be carried out in a commercially available processor, such as a Mercury Processor (Kodak Polychrome Graphics). Preferably, the developer temperature is from about 10° C. to about 50° C., more preferably about 15° C. to about 35° C. Following development, the printing plate is rinsed with water and dried. Drying may be conveniently carried out by IR heaters or with hot air. After drying, the printing plate may be treated with a gumming solution. A gumming solution comprises one or more water soluble polymers, for example polyvinylalcohol, polymethacrylic acid, polymethacrylamide, polyhydroxyethylmethacrylate, polyvinylmethacrylate, gelatin and polysaccharide such as dextrin, pullulan, cellulose, gum arabic and alginic acid. A preferred material is gum arabic.

While post-development heating or other operation is not normally necessary for this invention, such operations may be preferred for some applications.

The images obtained by the above described processing are suitable for many uses. For example, in the case of using a simple aluminum plate as the base, good prints are obtained by applying it to a printing machine after carrying out development. Further, a material prepared by providing a sensitive layer containing dyes on a transparent plastic film such as a polyester film can be used for correction of prints. In addition, it is possible to use photomasks, laser recording of output signals of computers and facsimile recording materials.

Moreover, the base of the developed sensitive material may be subjected to various processings according to the purpose. For example, in case of using a glass plate having a chromium vacuum deposition layer as the base, the chromium deposition layer is etched with a known etching solution containing ceric ion after the sensitive layer is developed to form a etching resist, and the resist layer is then removed, by which the base can be used as a hard mask. In case of using a silicon plate as the base, it is possible to make an etching resist of the silicon oxide layer or to use for a lift-off step. In case of using a copper foil plate for making a print circuit plate, it is possible to use as an etching resist or a plating resist after development.

The present invention is further described in detail by means of the following Examples and Comparison Example. All parts and percentages are by weight and all temperatures are degrees Celsius unless explicitly stated otherwise.

EXAMPLES

The following components were employed in the Examples and Comparison Example below. The formulations for the bottom coat layer and top coat layer for each Example are given in the Tables below.

Binder A is a terpolymer of methacrylamide, methacrylic acid and N-phenylmaleimide having mole fractions of 35 mol %; 20 mol %; and 45 mol %, respectively.

Binder B is P3000, a 214 naphthoquinonediazide sulfonate triester of pyrogallol acetone condensate a supplied by PCAS, Longjumeau, France.

Binder C is N-13 commercially novolak resin as supplied in acetone by Eastman Kodak Company, Rochester, N.Y.

Additive A is DE85, commercially a 215 naphthoquinonediazide sulfonate ester of trihydroxbenzophenone as supplied by ChemDesign, Massachusetts.

Additive B is BYK307 polyether-modified polydimethyl siloxane as supplied by BY Chem of Wallingford, Conn.

Additive C is FC-430 nonionic fluoroaliphatic polymer ester surfactant as supplied by 3M Specialty Chemical Division, St. Paul, Minn.

IR Dye A is 2-[2-[2-chloro-3-[(1,3-dihydro-1,1,3-trimethyl-2H-benz[e]indol-2 -ylidene)ethylidene]-1-cyclohexen-1-yl]ethenyl]-1,1,3-trimethyl-1H-Benz[e]indolium, salt with 4-methylbenzenesulfonic acid, available from Eastman Kodak Company, Rochester, N.Y. The structure is shown above.

Dye A is Basic Violet 3 as supplied by Ultra Colours and Chemicals of Cheadle Holme, Cheshire, UK.

Dye B is Brilliant Green as supplied by Aldrich of Milwaukee, Wis.

Substrate A is 0.3 gauge, aluminum sheet that has been electrograined, anodized, and treated with a solution of polyvinyl phosphoric acid.

Developer A is 956 developer, a solvent-based phenoxyethanol negative plate developer as supplied by Kodak Polychrome Graphics of Norwalk, Conn.

Developer B is a solution of Goldstar (1 part), a sodium metasilicate/surfactant positive plate developer as supplied by Kodak Polychrome Graphics of Norwalk, Conn., and water (3 parts).

CREO Trendsetter 3244 is a commercially available platesetter using Procom Plus software, operating at a wave length of 830 nm and supplied by Creo Products Inc. of Burnaby, BC.

Coatings were dried using a Mathis Labdrier as supplied by Werner Mathis AG, Zurich Switzerland.

Plates were exposed with ultra-thin radiation using light frame and OLIX A1 131 light integrator as supplied by OLEC Corporation of Irvine, Calif.

Formulation Examples 1–12 and Comparison Example 1

Coating components as percent of the dried films:

|  | Basecoat | | | Topcoat | | | | | | |
| --- | --- | --- | --- | --- | --- | --- | --- | --- | --- | --- |
| Example | Binder A | Dye B | Additive B | Binder B | Binder C | Additive A | IR dye A | Dye A | Additive B | Additive C |
| 1 | 97.5 | 2 | 0.5 | 83 | 0 | 0 | 15 | 1 | 0.5 | 0.5 |
| 2 | 97.5 | 2 | 0.5 | 78 | 0 | 0 | 20 | 1 | 0.5 | 0.5 |
| 3 | 97.5 | 2 | 0.5 | 78 | 0 | 0 | 20 | 1 | 0.5 | 0.5 |
| 4 | 97.5 | 2 | 0.5 | 73 | 0 | 10 | 15 | 1 | 0.5 | 0.5 |
| 5 | 97.5 | 2 | 0.5 | 68 | 0 | 10 | 20 | 1 | 0.5 | 0.5 |

-continued

| | Basecoat | | | Topcoat | | | | | | |
|---|---|---|---|---|---|---|---|---|---|---|
| Example | Binder A | Dye B | Additive B | Binder B | Binder C | Additive A | IR dye A | Dye A | Additive B | Additive C |
| 6 | 97.5 | 2 | 0.5 | 68 | 0 | 10 | 20 | 1 | 0.5 | 0.5 |
| 7 | 97.5 | 2 | 0.5 | 63 | 20 | 0 | 15 | 1 | 0.5 | 0.5 |
| 8 | 97.5 | 2 | 0.5 | 0 | 58 | 25 | 15 | 1 | 0.5 | 0.5 |
| 9 | 97.5 | 2 | 0.5 | 60 | 18 | 0 | 19 | 2 | 0.5 | 0.5 |
| 10 | 97.5 | 2 | 0.5 | 60 | 18 | 0 | 19 | 2 | 0.5 | 0.5 |
| 11 | 97.5 | 2 | 0.5 | 60 | 18 | 0 | 19 | 2 | 0.5 | 0.5 |
| 12 | 97.5 | 2 | 0.5 | 60 | 18 | 0 | 19 | 2 | 0.5 | 0.5 |
| C13 | 0 | 0 | 0 | 60 | 18 | 0 | 19 | 2 | 0.5 | 0.5 |

Example 1

The basecoat components were prepared as a 17% 'by weight' coating solution in methyl lactate/diethyl ketone/water at a ratio of 50:40:10. The coating was applied to substrate A with a 0.006 inch wire-wound bar to achieve a dry film weight of 2 $gm^{-2}$. The basecoat was dried at 100° C. for 60 seconds with a fan speed of 1000 rpm.

The topcoat was prepared as a 14% "by weight" coating solution in cyclohexanone/DOWANOL PM/acetone at a ratio of 53/47/0. It was applied to the basecoat substrate A with 0.006 inch wire wound bar achieve a film weight of 1.65 $g^{-2}$. The topcoat was dried at 100° C. for 60 seconds with a fan speed of 1000 rpm.

The coated plate was exposed to 200 units on a light frame before loading into CREO Trendsetters 3244. The plate was imaged using the internal test pattern, plot 0 at 8 Watts and drum speeds of 129 and 78 rpm. This corresponds to imaging energy densities of 150 and 250 $mJcm^{-2}$.

The exposed plate was immersed in Goldstar/water at a 1:3 ratio developer B and lightly swabbed for 40 seconds before rising with water. The plate demonstrated negative images at both exposure energies.

Example 2

The procedure and results were identical to that of Example 1, with the following differences. The topcoat was prepared as a 14% "by weight" coating solution in cyclohexanone/DOWANOL PM/Acetone at a ratio of 38/62/0.

Example 3

The procedure and results were identical to that of Example 2 with the following difference. The coating was developed in 956 developer. The plate demonstrated images at both 150 and 250 $mJcm^{-2}$.

Example 4

The procedure and results were identical to that of Example 1 except that the topcoat formulation was changed.

Example 5

The procedure and results were identical to that of Example 2 except that the topcoat formulation was changed.

Example 6

The procedure and results were identical to that of Example 1, with the following difference. The topcoat was prepared as a 14% "by weight" coating solution in cyclohexanone/DOWANOL PM/acetone at a ratio of 48/47/5.

Example 7

The procedure and results were identical to that of Example 6 with the following differences: The coating was developed in Developer A. The plate demonstrated images at both 150 and 250 $mJcm^{-2}$.

Example 8

The procedure and results were identical to that of Example 1, with the following differences: The topcoat was prepared as a 14% "by weight" coating solution in a solvent mixture of cyclohexanone/DOWANOLPM/acetone at a ratio of 36/47/17 and the top formulation was changed.

The coating only produced weak negative images with Goldstar/water at a 1:3 ratio and exposure requirement was greater that 250 $mJcm^{-2}$.

Example 9

The procedure and results were identical to that of Example 1, with the following differences. The basecoat components were prepared as a 15% "by weight" coating solution in methyl lactate/diethyl ketone/water at a ratio of 50:40:10. The coating was applied to substrate A with 0.006 inch wire wound bar to achieve a dry film weight of 1.8 $gm^{-2}$. A different topcoat formulation was prepared as a 17% "by weight" coating solution in cyclohexanone/DOWANOL/acetone at a ratio of 19/74/7. It was applied to the basecoat substrate A with a 0.006 inch wire-wound bar to achieve a film weight of 2.0 $gm^{-2}$.

The plate was imaged with the CREO Trendsetter 3244 using the internal test pattern, plot 0 to 8 Watts and drum speeds of 194, 155, 129, 97 and 78, corresponding to energies of 100, 125, 150, 200, and 250 $mJcm^{-2}$ respectively. Negative images were formed at all exposure energies.

Example 10

The procedure results were identical to that of Example 7, with the following differences: The topcoat was applied to the basecoat substrate A with 0.003 inch wire wound bar to achieve a film weight of 1.0 $gm^{-2}$

Example 11

The procedure and results were identical to that of Example 1, with the following differences: The basecoat components were prepared at 17% "by weight" coating solution in methyl lactate/diethyl ketone/water at a ratio of 50:40:10. The coating was applied to substrate A with a 0.006 inch wire wound bar to achieve a dry film weight of 2.0 $gm^{-2}$. A different topcoat formulation was used.

The plate was imaged with the trendsetter 3244 using internal test pattern, plot 0 to 8 Watts and drum speeds of 194, 129, 97, and 78, corresponding to energies of 100, 150, 200 and 250 mJcm$^{-2}$ respectively. The plate demonstrated negative images at exposure energies of 70 mJcm$^{-2}$ or more.

Example 12

The procedure and results were identical to that in Example 9, with the following difference: The basecoat components were prepared as a 12.5% "by weight" coating solution in methyl lactate/diethyl ketone/water ratio of 50:40:10. The coating was applied to substrate A with a 0.006 inch wire wound bar to achieve a dry film weight of 15.gm$^{-2}$.

Comparative Example 13

The procedure and results were identical to that of Example 9, with the following difference: Only the 'topcoat' formulation was applied to substrate A. During development, the plate exhibited significant 'background scumming' using Goldstar/water 1:3 developer solution. The scum could only be removed by using 100% Goldstar developer, whereby exposure requirements was greater than 250 mJcm$^{-2}$.

While the invention has been described above with reference to specific embodiments thereof, it is apparent that many changes, modifications, and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A negative-working image forming process which comprises the steps of:
   (1) flood exposing with actinic radiation a photosensitive assembly that comprises:
      (a) a hydrophilic support which can be used as a lithographic base and having thereon;
      (b) a first layer comprising:
         (i) at least one polymer that is soluble or dispersible in an aqueous alkaline solution, wherein the polymer in the first layer is a copolymer having at least one functional group selected from the group consisting of carboxylic acid, N-substituted cyclic imide, and amide;
      (c) a second layer on top of the first layer, the second layer comprising at least one o-quinonediazide compound; whereby the flood exposure coverts the at least one O-quinonediazide compound to the corresponding indenecarboxylic acid compound; and
      (d) at least one photothermal conversion material in either the first layer, the second layer, or both layers, wherein the at least one photothermal conversion material is at least one infrared absorbing compound;
   (2) imagewise exposing the flood exposed photosensitive assembly with infrared radiation and converting the indenecarboxylic acid compound in the second layer in the imagewise exposed areas to the corresponding indene compound; and
   (3) developing the imagewise exposed photosensitive assembly with an alkaline developing solution and dissolving out the imagewise unexposed areas of the second layer and the areas of the first layer underlying the imagewise unexposed areas of the second layer.

2. The process of claim 1 wherein the support is a polyester film.

3. The process of claim 1 wherein the support is a sheet of anodized aluminum.

4. The process of claim 1 wherein the o-quinonediazide compound comprises either (i) a mixture of a phenolic resin and an o-naphthoquinone diazide compound; (ii) a reaction product of a resin and an o-naphthoquinone diazide compound; or (iii) a mixture of (i) and (ii).

5. The process of claim 1 wherein the at least one infrared absorbing compound is in the second layer.

6. The process of claim 1 wherein the thickness of the first layer is from about 0.5 to about 2.5 microns.

7. The process of claim 1 wherein the thickness of the second layer is from about 0.5 to about 2.5 microns.

8. The process claim 1 wherein the polymer in the first layer is a copolymer of N-phenyl maleimide, methacrylamide and methacrylic acid.

9. The process claim 8 wherein the polymer in the first layer comprises about 25 to 75 mol % of N-phenylmaleimide; about 10 to about 50 mol % of methacrylamide; and about 5 to about 30 mol % of methacrylic acid.

10. The process of claim 1 wherein the polymer in the first layer comprises about 35 to about 60 mol % of N-phenylmaleimide; about 15 to about 40 mol % of methacrylamide; and about 10 to about 30 mol % of methacrylic acid.

11. A negative-working image forming process which comprises the steps of:
   (1) flood exposing with ultraviolet radiation a photosensitive assembly that comprises:
      (a) an aluminum plate hydrophilic support which can be used as a lithographic base and having thereon;
      (b) a first layer comprising:
         (i) at least one copolymer that is soluble or dispersible in an aqueous alkaline solution and has at least one functional group selected from the group consisting of carboxylic acid, N-substituted cyclic imide, amide, and mixtures thereof;
      (c) a second layer on top of the first layer, the second layer comprising at least one o-quinonediazide compound that comprises either (i) a mixture of a phenolic resin and an o-naphthoquinone diazide compound; (ii) a reaction product of a resin and an o-naphthoquinone diazide compound; or (iii) a mixture of (i) and (ii); whereby the flood ultraviolet exposure converts the at least one o-quinonediazide compound to the corresponding indenecarboxylic acid compound; said second layer additionally comprising an infrared absorbing compound;
   (2) imagewise exposing the flood ultraviolet exposed photosensitive assembly with infrared radiation and converting the indenecarboxylic acid compound in the second layer in the imagewise exposed areas to the corresponding indene compound; and
   (3) developing the imagewise exposed photosensitive assembly with an alkaline developing solution and dissolving out the imagewise unexposed areas of the second layer and the areas of the first layer underlying the imagewise unexposed areas of the second layer.

12. The process of claim 11 wherein copolymer in the first layer comprises at least 90% by weight of the first layer.

13. The process of claim 11 wherein the infrared absorbing compound comprises from about 5 to about 25 weight percent of the second layer.

14. The process of claim 11 wherein the developing solution has a pH from about 8 to about 13.5.

15. The process of claim 11 wherein the at least one copolymer in the first layer comprises about 35 to about 60 mol % of N-phenylmaleimide; about 15 to about 40 mol % of methacrylamide; and about 10 to about 30 mol % of methacrylic acid.

16. A negative-working image-forming process which comprises the steps of:

(1) flood exposing with ultraviolet radiation a photosensitive assembly that comprises:

(a) an anodized aluminum plate hydrophilic support which can be used as a lithographic base and having thereon;

(b) a first layer comprising:

(I) a terpolymer of methacrylamide, methacrylic acid and N-phenylmaleimide that is soluble or dispersible in an aqueous alkaline solution;

(c) a second layer on top of the first layer, the second layer comprising at least one o-quinonediazide compound that comprises either (i) a mixture of a phenolic resin and an o-naphthoquinone diazide compound; (ii) a reaction product of a resin and an o-naphthoquinone diazide compound; or (iii) a mixture of (i) and (ii); whereby the flood ultraviolet exposure converts the at least one O-quinonediazide compound to the corresponding indenecarboxylic acid compound; said second layer additionally comprising an infrared absorbing compound;

(2) imagewise exposing the flood ultraviolet exposed photosensitive assembly with infrared laser radiation and converting the indenecarboxylic acid compound in the second layer in the imagewise exposed areas to the corresponding indene compound; and (3) developing the imagewise exposed photosensitive assembly with an alkaline developing solution and dissolving out the imagewise unexposed areas of the second layer and the areas of the first layer underlying the imagewise unexposed areas of the second layer.

17. The process of claim 16 wherein the first layer additionally comprises a colorant and a coating improver.

18. The process of claim 16 wherein the terpolymer in the first layer comprises mole fractions of 35:20:45 of the methacrylamide, methacrylic acid and N-phenylmaleimide.

19. The process of claim 16 wherein the terpolymer in the first layer comprises about 35 to about 60 mol % of N-phenylmaleimide; about 15 to about 40 mol % of methacrylamide; and about 10 to about 30 mol % of methacrylic acid.

* * * * *

UNITED STATES PATENT AND TRADEMARK OFFICE
CERTIFICATE OF CORRECTION

PATENT NO. : 6,800,426 B2
DATED : October 5, 2005
INVENTOR(S) : Kevin B. Ray and Anthony P. Kitson It is certified that error appears in the above-identified patent and that said Letters Patent is hereby corrected as shown below:

Title page,
Item [56], References Cited, OTHER PUBLICATIONS, "Reiser Photoreactive Polymers, The Science and Technology of Resists, Wiley-Interscience, New York, 1989, pp. 161-167." to -- Reiser, Photoreactive Polymers, The Science and Technology of Resists, Wiley-Interscience, New York, 1989, pp. 181-187 --.

Signed and Sealed this

Seventh Day of June, 2005

JON W. DUDAS
*Director of the United States Patent and Trademark Office*